United States Patent
Bao et al.

(10) Patent No.: US 12,033,955 B2
(45) Date of Patent: Jul. 9, 2024

(54) ELECTROMAGNETIC SHIELDING PACKAGE STRUCTURE COMPRISING ELECTROPLATING LAYER AND PACKAGE METHOD THEREOF

(71) Applicant: JCET GROUP CO., LTD., Wuxi (CN)

(72) Inventors: Man Bao, Wuxi (CN); Yi Liu, Wuxi (CN); Zhen Gong, Wuxi (CN)

(73) Assignee: JCET GROUP CO., LTD., Jiangsu Province (CN)

( * ) Notice: Subject to any disclaimer, the term of this patent is extended or adjusted under 35 U.S.C. 154(b) by 348 days.

(21) Appl. No.: 17/613,054

(22) PCT Filed: Oct. 24, 2019

(86) PCT No.: PCT/CN2019/113021
§ 371 (c)(1),
(2) Date: Nov. 20, 2021

(87) PCT Pub. No.: WO2021/017206
PCT Pub. Date: Feb. 4, 2021

(65) Prior Publication Data
US 2022/0223540 A1    Jul. 14, 2022

(30) Foreign Application Priority Data
Jul. 26, 2019 (CN) .......................... 201910681409.7

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4871* (2013.01); *H01L 21/56* (2013.01); *H01L 24/48* (2013.01); *H01L 2224/48245* (2013.01)

(58) Field of Classification Search
CPC ... H01L 23/552; H01L 21/4871; H01L 21/56; H01L 24/48–49; H01L 2224/48245
(Continued)

(56) References Cited

U.S. PATENT DOCUMENTS 8,604,596 B2 * 12/2013 Camacho .......... H01L 23/49548
257/676
10,593,612 B2 * 3/2020 Somma ............. H01L 23/49548
(Continued)

FOREIGN PATENT DOCUMENTS

CN  101339940 A   1/2009
CN  109698187 A   4/2019

*Primary Examiner* — Didarul A Mazumder
(74) *Attorney, Agent, or Firm* — Cheng-Ju Chiang (57) ABSTRACT

The present invention discloses an electromagnetic shielding package structure and a package method thereof. The package method for the electromagnetic shielding package structure includes: providing a base plate of a copper raw material, and forming a transition layer after two photoresist film operations, wherein the transition layer includes conductive connecting ribs connecting functional pins to an outer side wall; mounting a chip. performing first encapsulating, and etching off the conductive connecting ribs connecting the functional pins to the outer side wall; performing secondary encapsulating on an etched part; and after forming a singulated body by cutting, blocking the connection between the functional pins and the outer side wall by a plastic package material, and only reserving grounding pins to be connected to the outer side wall through the conductive connecting ribs. In this way, after a metal protective layer is sputtered, only the conductive connecting ribs and the shielding cover are enabled to be conducted to form the electromagnetic shielding package structure. According to the present invention, the performance of the package is improved, and the manufacturing cost and the use cost are reduced.

10 Claims, 5 Drawing Sheets

(51) Int. Cl.
*H01L 21/56* (2006.01)
*H01L 23/00* (2006.01)

(58) Field of Classification Search
USPC .......................................... 257/659
See application file for complete search history.

(56) References Cited

U.S. PATENT DOCUMENTS

| | | | |
|---|---|---|---|
| 2009/0108444 A1* | 4/2009 | Chuang | H01L 21/568 |
| | | | 257/737 |
| 2009/0230526 A1* | 9/2009 | Chen | H01L 23/49548 |
| | | | 257/676 |
| 2010/0258934 A1* | 10/2010 | Chang Chien | H01L 21/565 |
| | | | 257/E23.116 |
| 2011/0175210 A1 | 7/2011 | Yao et al. | |
| 2012/0243191 A1 | 9/2012 | Wu | |
| 2015/0070046 A1* | 3/2015 | Takano | H01L 24/48 |
| | | | 257/659 |
| 2015/0373849 A1* | 12/2015 | Huang | H05K 3/188 |
| | | | 361/767 |

\* cited by examiner

ELECTROMAGNETIC SHIELDING PACKAGE STRUCTURE COMPRISING ELECTROPLATING LAYER AND PACKAGE METHOD THEREOF

CROSS-REFERENCE TO RELATED APPLICATION

The present application claims priority to Chinese Patent Application No. 201910681409.7, filed on Jul. 26, 2019 and entitled "ELECTROMAGNETIC SHIELDING PACKAGE STRUCTURE AND PACKAGE METHOD THEREOF", the entire content of which is incorporated herein by reference.

TECHNICAL FIELD

The present invention belongs to the field of semiconductor manufacturing, and in particular relates to an electromagnetic shielding package structure and a package method thereof.

BACKGROUND

With the trend of multi-functionalization and miniaturization of electronic products, a high-density microelectronic assembly technology has gradually become the mainstream in a new generation of the electronic products. In order to match the development of the new generation of electronic products, especially the development of smart phones, palmtop computers, ultrabooks and other products, an integrated circuit package has also developed in the direction of miniaturization, high density, high power, and high speed. As electronic components become smaller and work at higher frequencies, high-frequency chips will generate strong electromagnetic waves during transportation and transmission, which will usually cause an unexpected interference or noise to other chips in the package or electronic components outside the package. In addition, since the density of the electronic components is too high, and signal transmission lines between the electronic components are closer and closer, the electromagnetic interference from the chips outside or inside the integrated circuit package is more and more serious. Meanwhile, the electrical quality and the heat dissipation efficiency of the integrated circuit package are reduced accordingly.

In order to solve the problem of electromagnetic interference, in the prior art, usually, a metal cover is bonded or a metal layer is plated on the outer surface of the package to shield the emission and reception of electromagnetic waves. In the existing molding process of the package with a shielding cover, functions are realized by a substrate package mostly. The main reason is that a substrate processing technology adopts a copper clad laminate as a carrier plate, and after exposure, development, electroplating, etching and other processes, a functional line can be reserved within a cutting line, and a grounding line can extend outside the cutting line to achieve an electromagnetic shielding effect. The cost of using the substrate to achieve the shielding effect is very high, and is about 10 times higher than the cost of packaging on a base plate made of a copper raw material. In addition, in the case of using the substrate as the carrier plate, the reliability is low and the thermal conductivity is poor since raw materials used in the substrate contain a core material and ink. Compared with the package formed by packaging on the base plate made of a copper raw material, the reliability is relatively poor, only MSL3 is achievable, and the thermal conductivity is also relatively poor.

Therefore, it is necessary to provide a technology and a package which use the base plate made of a copper raw material as the carrier plate, and perform packaging and shielding thereon, so as to improve performance of the package and reduce a manufacturing cost.

SUMMARY

Objects of the present invention are to provide an electromagnetic shielding package structure and a package method thereof that solve the above technical problems.

In order to achieve one of the above objects of the present invention, an embodiment of the present invention provides a package method for an electromagnetic shielding package structure. The method includes: S1, providing a base plate made of a copper raw material;

S2, performing electroplating in an electroplating area of the base plate to form an electroplating layer on the base plate;

S3, performing etching on the base plate on which the electroplating layer is formed to wholly form a transition layer, wherein the transition layer includes: pins, conductive connecting ribs of which one ends are connected to the pins and the other ends extend to a singulated cutting line, and the etched electroplating layer, and the pins include: functional pins and grounding pins;

S4, bonding a high temperature-resistant protective film on the back surface of the transition layer;

S5, mounting a chip on the front surface of the transition layer, and electrically connecting the chip to the functional pins;

S6, performing first encapsulating on the front surface of the transition layer;

S7, peeling off the high temperature-resistant protective film covering the back surface of the transition layer;

S8, etching the conductive connecting ribs connected to the functional pins from the back surface of the transition layer to form several grooves at the positions corresponding to the etched conductive connecting ribs, so that the transition layer excluding the electroplating layer forms a circuit layer; wherein the circuit layer includes: the functional pins, the grounding pins, and the conductive connecting ribs connected to all the grounding pins respectively;

S9, performing secondary encapsulating from the back surface of the circuit layer, wherein an encapsulation area at least includes the grooves formed in step S8;

S10, cutting a half-formed package formed in step S9 from the singulated cutting line to form several singulated packages; and S11, sputtering a metal protective layer uniformly on a plastic package cover of the singulated package to form a shielding cover, and enabling the conductive connecting ribs and the shielding cover to be conducted to form an electromagnetic shielding package structure.

As a further improvement of an embodiment of the present invention, step S1 specifically includes:

S1-1, providing a copper raw material; and

S1-2, performing acid washing or alkali washing pretreatment on a copper surface to clean the copper surface to acquire the base plate.

As a further improvement of an embodiment of the present invention, step S2 specifically includes:

S21, bonding a photoresist film on the base plate;

S22, removing part of the photoresist film through an exposure machine and a development machine to expose the electroplating area on the base plate;

S23, electroplating nickel, palladium, gold or silver in the electroplating area of the base plate; and S24, peeling off the remaining photoresist film on the base plate.

As a further improvement of an embodiment of the present invention, step S3 specifically includes:

S31, bonding the photoresist film on the base plate on which the electroplating layer is formed;

S32, removing part of the photoresist film through the exposure machine and the development machine to expose an etching area;

S33, etching off the base plate in the etching area to reserve the transition layer bonded to the photoresist film; and S34, peeling off the remaining photoresist film to form the transition layer.

As a further improvement of an embodiment of the present invention, between step S3 and step S4, the method further includes: dividing the transition layer formed in step S3 into strips with a punch mold or router manner.

As a further improvement of an embodiment of the present invention, step S7 further includes: removing a residual adhesive layer caused by removing the protective film on the back surface of the circuit with a chemical agent.

As a further improvement of an embodiment of the present invention, the area of the secondary encapsulation further includes: a non-plastic package area between the electroplating layers on the back surface of the circuit layer.

As a further improvement of an embodiment of the present invention, the metal protective layer sputtered on the plastic package cover of the singulated package sequentially includes an inner stainless steel layer, a copper layer, and an outer stainless steel layer from inside to outside.

In order to achieve one of the above objects of the present invention, an embodiment of the present invention provides an electromagnetic shielding package structure, wherein the electromagnetic shielding package structure includes: a circuit layer made of a copper material, wherein the circuit layer includes functional pins, grounding pins, and conductive connecting ribs connected to all the grounding pins respectively and extending toward the side surface of the electromagnetic shielding package structure;

a shielding cover disposed on the front surface of the circuit layer and forming a cavity with the circuit layer, wherein the side wall of the shielding cover extends to the side surface of the circuit layer and is connected to each of the conductive connecting ribs;

an electroplating layer disposed on the front surface and the back surface of the circuit layer;

a chip disposed in the cavity and electrically connected to the functional pins; and a plastic package material filling a gap between the cavity and the circuit layer, wherein the plastic package material isolates the shielding cover from contacting the functional pins.

As a further improvement of an embodiment of the present invention, the side wall of the shielding cover extends to the electroplating layer; and the plastic package material is further configured to fill a gap between the electroplating layers.

Compared with the prior art, in the electromagnetic shielding package structure and the package method thereof according to the present invention, the transition layer is directly formed on the base plate made of a copper raw material, the first encapsulating is performed on the transition layer, the conductive connecting ribs connected to the functional pins are removed by the etching process, and the secondary encapsulating is performed to fill the grooves of the conductive connecting ribs, so that the functional pins are wrapped in the plastic package material, the grounding pins are electrically connected to the shielding cover on the outer wall surface of the plastic package body through the conductive connecting ribs, and further the grounding pins inside the plastic package body are connected to a shielding metal to realize shielding, thereby improving the performance of the package, and reducing the manufacturing cost and use cost.

DETAILED DESCRIPTION

Hereinafter, the present invention will be described in detail in combination with specific embodiments shown in the drawings. However, the present invention is not limited to these embodiments, and the structural, method, or functional changes made by those skilled in the art according to these embodiments are all contained in a protection scope of the present invention.

Figure 1:
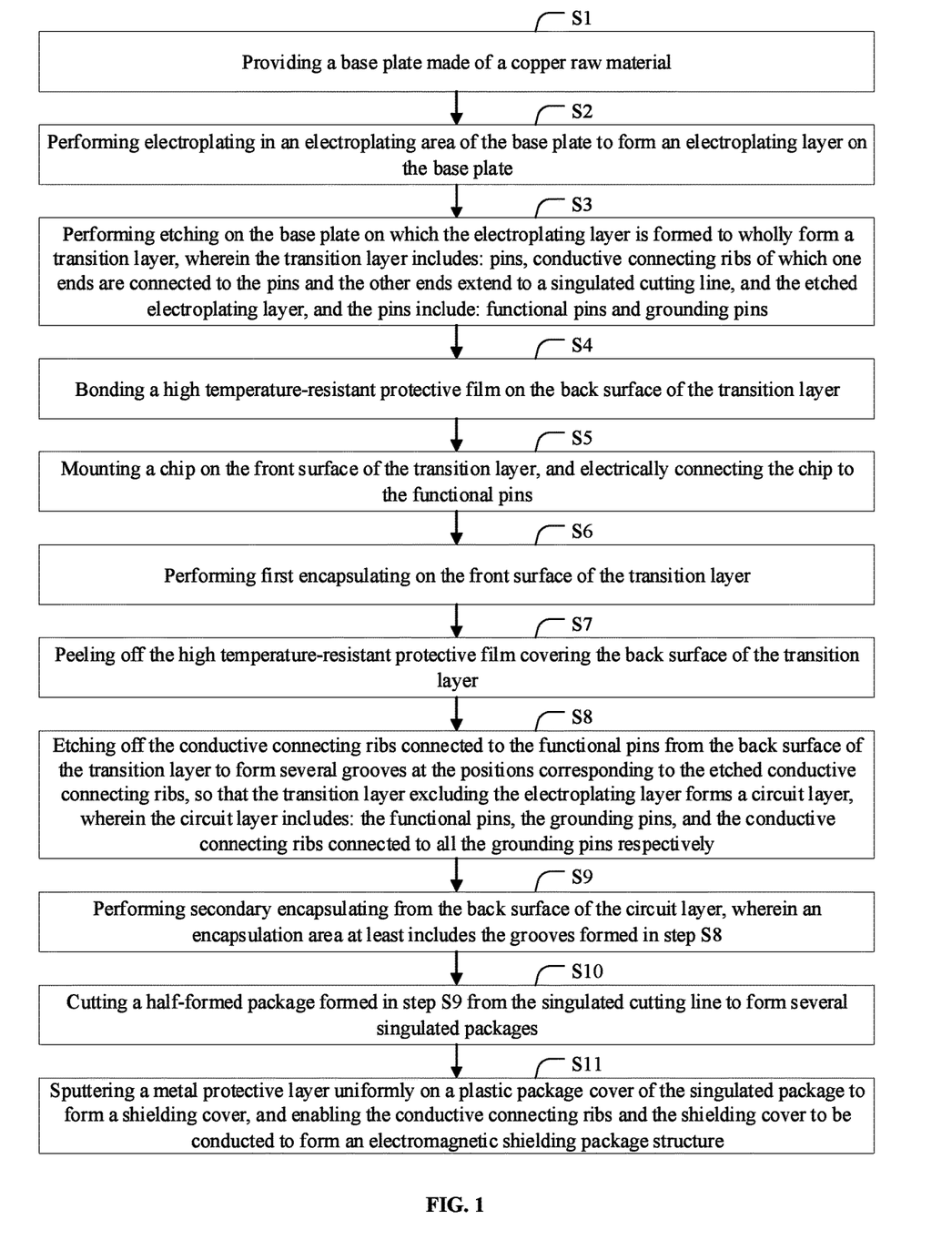
FIG. 1 is a schematic flowchart of a package method for an electromagnetic shielding package structure according to an embodiment of the present invention.
Figure 2:
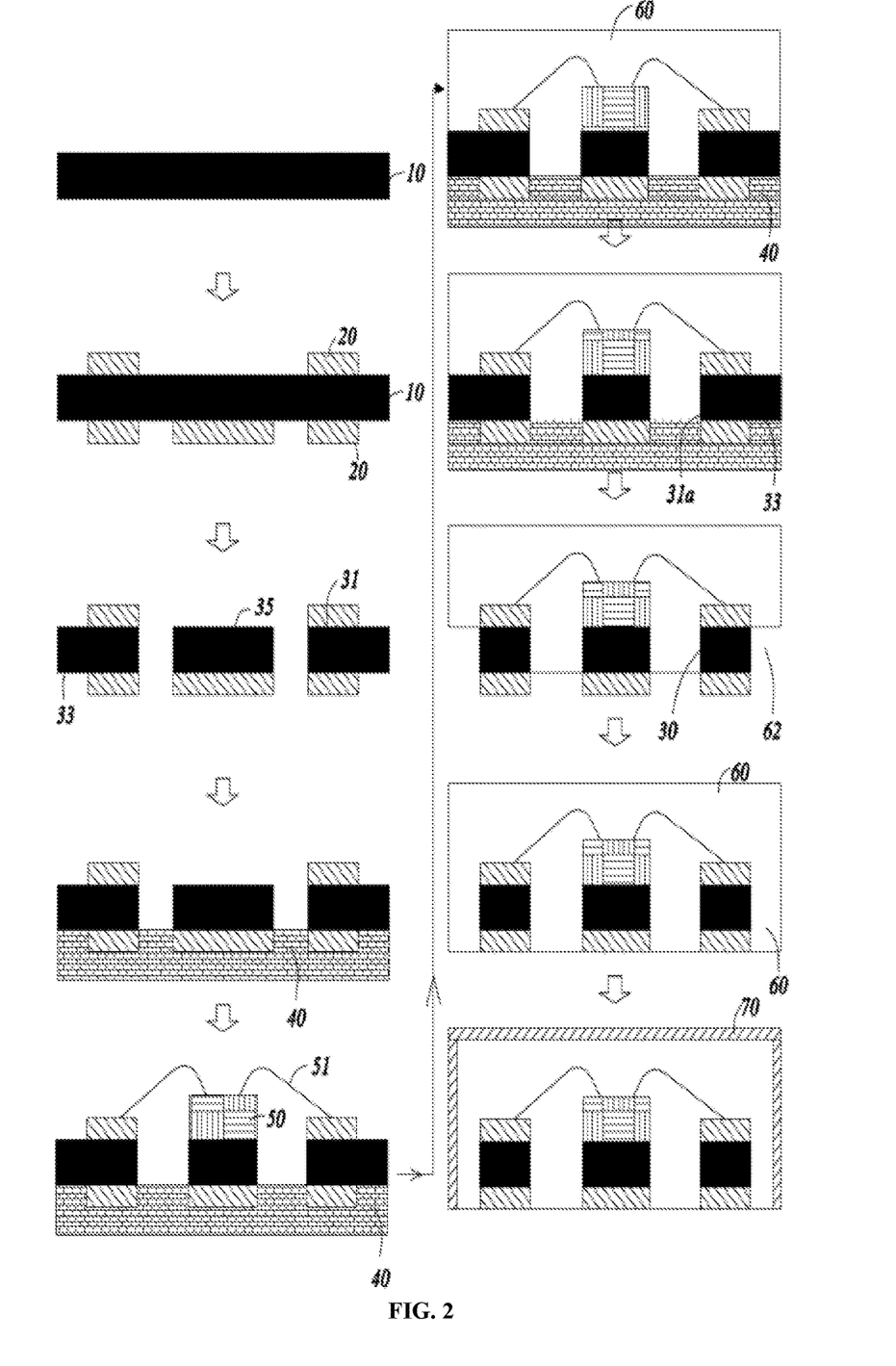
FIG. 2 is a schematic diagram corresponding to steps of the package method shown in FIG. 1 according to the present invention.
Figure 3:
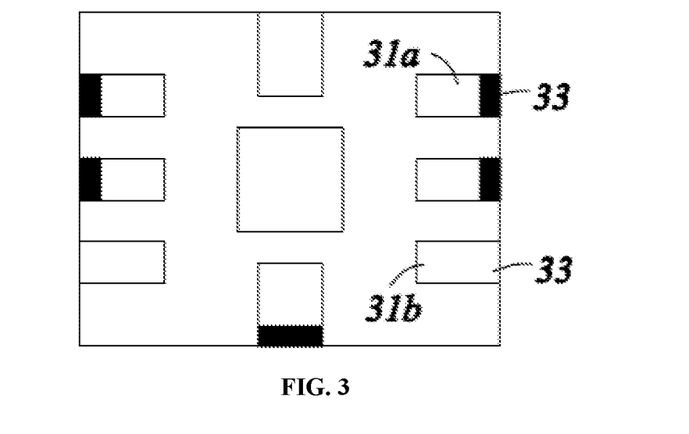
FIGS. 3 and 4 are respectively schematic structural diagrams of a connection relationship between conductive connecting ribs and pins in the forming process of an electromagnetic shielding package structure according to the present invention.

In combination with FIGS. 1 and 2, an embodiment of the present invention provides a package method for an electromagnetic shielding package structure, the method includes:

S1, providing a base plate 10 made of a copper raw material;

S2, performing electroplating in an electroplating area of the base plate 10 to form an electroplating layer 20 on the base plate 10;

S3, performing etching on the base plate 10 on which the electroplating layer 20 is formed to wholly form a transition layer, wherein in combination with FIG. 3 which mainly shows conductive connecting ribs in the transition layer, the transition layer at least includes: pins 31, the conductive connecting ribs 33 of which one ends are connected to the pins 31 and the other ends extend to a singulated cutting line, and the etched electroplating layer 20, and the pins 31 include: functional pins 31*a* and grounding pins 31*b;*

S4, covering the back surface of the transition layer with a high temperature-resistant protective film 40;

S5, mounting a chip 50 on the front surface of the transition layer, and electrically connecting the chip 50 to the functional pins 31*a;*

Figure 4:
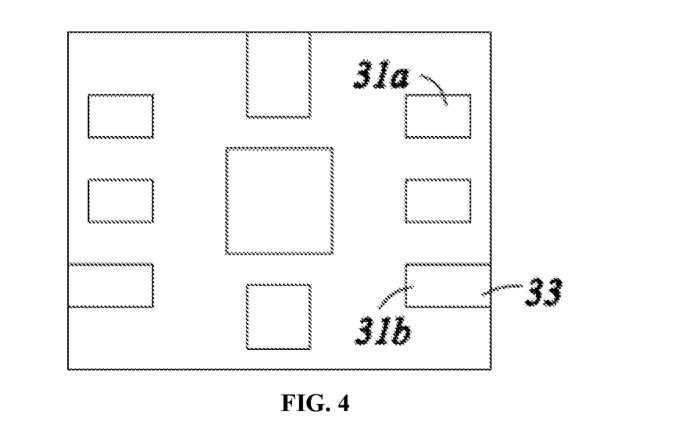

S6, performing first encapsulating on the front surface of the transition layer;

S7, peeling off the high temperature-resistant protective film 40 covering the back surface of the transition layer;

S8, etching off the conductive connecting ribs 33 connected to the functional pins 31*a* from the back surface of the transition layer to form several grooves 62 at the positions corresponding to the etched conductive connecting ribs, so that the transition layer excluding the electroplating layer 20 forms a circuit layer 30, wherein in combination with FIG. 4 which mainly shows the conductive connecting ribs in the circuit layer formed after processing the transition layer, the circuit layer 30 at least includes: the functional pins 31*a*, the grounding pins 31*b*, and the conductive connecting ribs 33 connected to all the grounding pins 31*b* respectively;

S9, performing secondary encapsulating from the back surface of the circuit layer 30, wherein an encapsulation area at least includes the grooves 62 formed in step S8;

S10, cutting a half-formed package formed in step S9 from the singulated cutting line to form several singulated packages; and S11, sputtering a metal protective layer uniformly on a plastic package cover of the singulated package to form a shielding cover 70, and enabling the conductive connecting ribs 33 and the shielding cover 70 to be conducted to form an electromagnetic shielding package structure.

In a specific embodiment of the present invention, step S1 specifically includes: S1-1, providing a copper raw material, wherein the thickness of the provided copper raw material may be selected according to the thickness of a product, and since the copper raw material is a metal alloy material, the reliability and heat dissipation of an encapsulated product with the copper raw material as a carrier plate can be improved; and S1-2, performing acid washing or alkali washing pretreatment on a copper surface of the copper raw material to clean the copper surface to acquire the base plate 10. Step S1 aims to remove lipids and other substances on the copper surface for the purpose of cleaning the copper surface.

In a specific embodiment of the present invention, first film bonding is performed in step S2 for subsequent electroplating. Specifically, step S2 specifically includes: S21, bonding a photoresist film on the base plate 10, wherein the photoresist film is usually bonded to the front surface and back surface of the base plate 10, and the photoresist film may be a dry photoresist film or a wet photoresist film; S22, removing part of the photoresist film through an exposure machine and a development machine to expose the electroplating area on the base plate 10, wherein in this step, after pattern exposing and developing are performed at the position where the photoresist film is bonded and removing part of the photoresist film, the copper surface of the base plate 10 is exposed; S23, electroplating nickel, palladium, gold or silver in the electroplating area of the base plate 10; and S24, peeling off the remaining photoresist film on the base plate 10, wherein in this step, the remaining photoresist film on the base plate 10 can be peeled off with a film peeling solution. It should be noted that the purpose of disposing the conductive connecting ribs 33 in the present invention is to connect the grounding pins 31*b* and the shielding cover 70 through the conductive connecting ribs 33 to achieve shielding. Thus, in this specific embodiment, the conductive connecting ribs 33 connected to the functional pins 31*a* need to be etched off subsequently. In this way, the conductive connecting ribs 33 connected to the functional pins 31*a* are excluded from the electroplating area, that is, when in electroplating, the conductive connecting ribs 33 connected to the functional pins 31*a* do not need to be electroplated, but the conductive connecting ribs connected to the grounding pins 31*b* need to be electroplated when being divided into the electroplating area.

In a specific embodiment of the present invention, second film bonding is performed in step S3. Specifically, step S3 specifically includes: S31, bonding the photoresist film on the base plate 10 on which the electroplating layer 20 is formed, wherein the photoresist film may also be a dry photoresist film or a wet photoresist film; S32, removing part of the photoresist film through the exposure machine and the development machine to expose an etching area, wherein in this step, after pattern exposing and developing are performed at the position where the photoresist film is bonded and removing part of the photoresist film, the copper surface of the base plate 10 is exposed; S33, etching off the base plate 10 in the etching area to reserve the transition layer bonded to the photoresist film, wherein in this step, the reserved base plate 10 covered by the photoresist film and the electroplating layer are circuits needing to be reserved; and S34, peeling off the remaining photoresist film to form the transition layer. According to different package types, in addition to the pins 31 and the conductive connecting ribs 33, the transition layer may also include a base island 35, which will be described in the following.

Between step S3 and step S4, the method further includes: dividing the transition layer formed in step S3 into strips with a punch mold or router manner to facilitate subsequent cutting.

For the transition layer formed in step S4, respective components may be connected to each other or disconnected. In this way, the high temperature-resistant protective film 40 is bonded to the back surface of the transition layer. The high temperature-resistant protective film 40 is bonded to the back surface of the transition layer, and fills a gap between the electroplating layers 20 on the back surface of the transition layer, so that the respective components are connected through the protective film, which is convenient for subsequent encapsulation and use.

Figure 5:
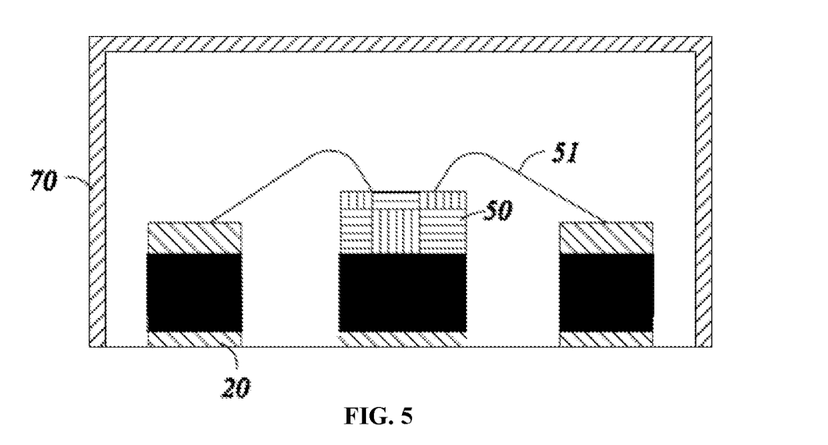
FIG. 5 is a schematic structural diagram of a WB-type package product.

For step S5, in combination with FIG. 5, for a WB-type package product, the chip 50 is disposed on the front surface of the base island 35 through adhesive glue, and then the chip 50 is electrically connected to the functional pins 31*a* via welding wires 51.

Figure 6:
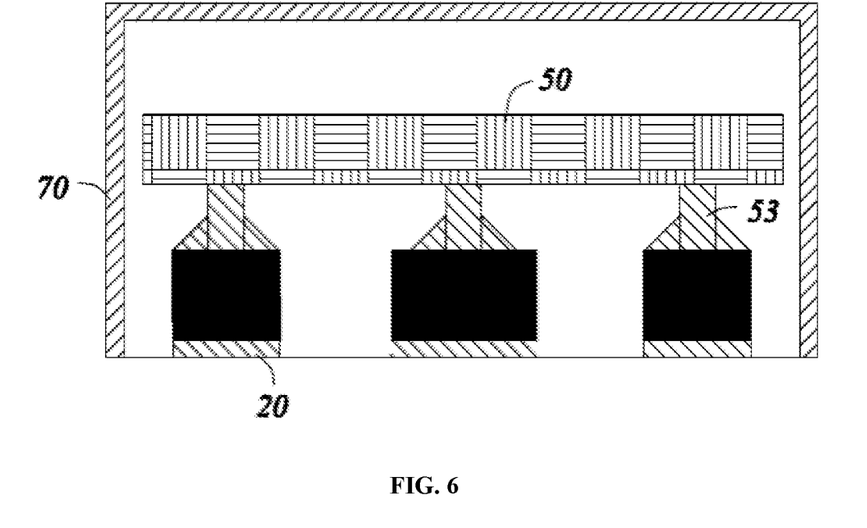
FIG. 6 is a schematic structural diagram of an FC-type package product.

In combination with FIG. 6, for an FC-type package product, the chip 50 is electrically connected to the pins through bumps 53.

Figure 7:
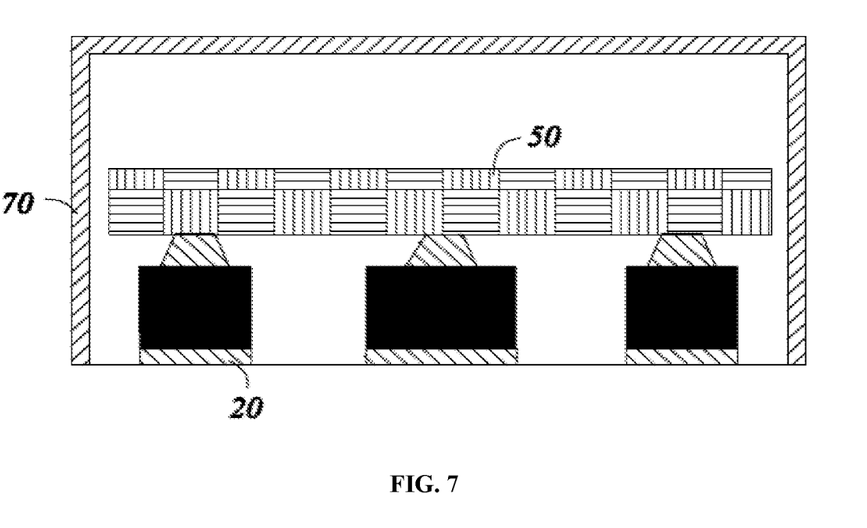
FIG. 7 is a schematic structural diagram of an SMT-type package product.

In combination with FIG. 7, for an SMT package product, the chip 50 herein is a passive component such as an inductor, a capacitor, a resistor, or a sensor, and is directly welded on the functional pins 31*a*.

For step S6, the first encapsulating is performed from the front surface of the transition layer, plastic packaging of epoxy resin may be performed on the front surface of the transition layer, and a plastic package material 60 fills all the gaps above the high temperature-resistant protective film 40.

Step S7 corresponds to step S5, after the first encapsulation is completed, the temporarily bonded high temperature-resistant protective film 40 needs to be torn off to facilitate the secondary encapsulation.

In a preferred embodiment of the present invention, step S7 further includes: removing a residual adhesive layer caused by removing the protective film on the back surface of the circuit with a chemical agent. The chemical agent, such as potassium hydroxide and organic amine and other mixed alkaline lotion.

In step S8, on the back surface of the transition layer, the conductive connecting ribs 33 connected to the functional pins 31a are not electroplated, and are still the copper surface. The conductive connecting ribs 33 at these positions may be etched off with an etching solution, and the conductive connecting ribs 33 connected to the grounding pins 31b are reserved. In this way, the connection between the functional pins 31a and the side wall is cut off, and only the connection between the grounding pins 31b and the side wall through the conductive connecting ribs 33 is reserved to form the circuit layer 30. In this step, after the conductive connecting ribs 33 at the corresponding positions are etched off, on the back surface of the product that is not finally formed in step S7, the several grooves 62 are formed at the positions corresponding to the etched conductive connecting ribs. The bottom of each groove 62 exposes the plastic package material 60 encapsulated for the first time, and at least one side wall of each groove 62 exposes the functional pin 31a.

In step S9, the secondary encapsulating is performed from the back surface of the circuit layer 30. There are two encapsulation manners. In the example shown in FIG. 2, all the gaps above the back surface of the circuit layer 30 are filled with the plastic package material 60. In the present embodiment, epoxy resin glue is used to fill the back surface of the circuit layer 30. The filled area includes each groove 62 formed in step S8 and the area not covered with the plastic package material 60 between the back surface of the circuit layer 30 and the electroplating layer 20. At this point, through the plastic packaging of the epoxy resin glue, the side wall surface of the package of the chip 50 is stopped from being exposed, so as to facilitate subsequent metal shielding.

Figure 8:
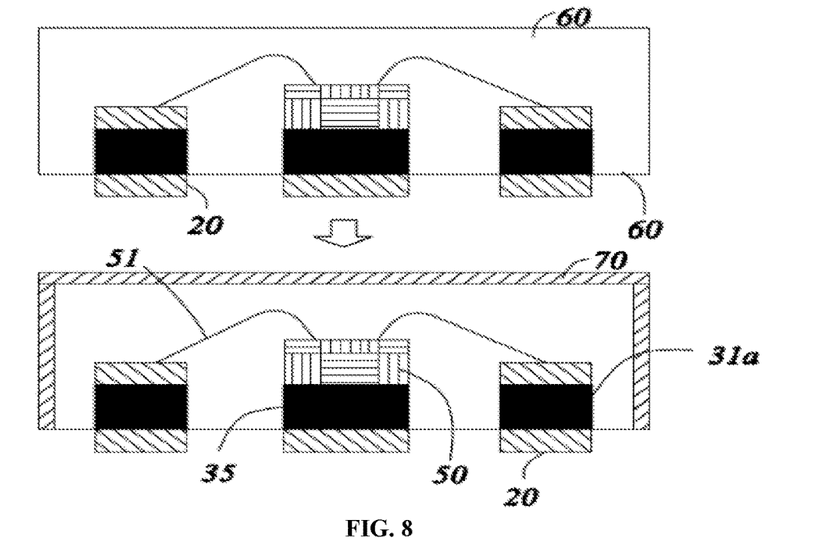
FIG. 8 is a partially schematic structural diagram of an electromagnetic shielding package structure in a forming process in another embodiment of the present invention.

In combination with FIG. 8, when in the secondary encapsulation, the filled area only includes each groove 62 formed in step S8, and the non-plastic package area between the electroplating layers 20 on the back surface of the circuit layer 30 is not subjected to secondary plastic packaging. At this point, the side wall surface of the chip 50 is also blocked from being exposed by the plastic packaging of the epoxy resin, so as to facilitate subsequent metal shielding.

In step S10, with a cutting machine, the product is cut into singles from strip arrangement. At this point, the side wall of the single product is blocked by the plastic package material to prevent the functional pins 31a from being electrically connected to the side wall, while under the action of the conductive connecting ribs 33, the conductive connecting ribs 33 extend to the side wall of the single product, so as to ensure that the grounding pins 31b are electrically connected to the side wall, which is convenient for connecting the grounding pins 31b to the metal shielding cover 70 subsequently.

After step S10, the method further includes: cleaning the singulated package to remove foreign matter and/or grease on the surface of the singulated package. The cleaning manner, for example, is alcohol immersion and ultrasonic cleaning.

In step S11, in combination with FIGS. 2 and 8, the plastic package cover of the product includes 5 surfaces except the back surface. In a preferred embodiment of the present invention, the metal protective layer includes 3 layers, which successively include an inner stainless steel layer, a copper layer and an outer stainless steel layer from inside to outside. The purpose of sputtering the inner stainless steel layer is to increase a binding force with the plastic package material, the thickness of this layer is usually 0.1 µm, and the purpose of sputtering the outer stainless steel layer is to protect the middle copper layer from oxidization. The thickness of the middle copper layer is usually 5 to 9 µm, and the thickness of the outer stainless steel layer is usually 0.1 to 0.3 µm. After sputtering the metal protective layer on the outer wall surface of the singulated package, the conductive connecting ribs 33 connected to the grounding pins 31b extend to the side wall surface, so that the functional pins 31b can be electrically connected to the shielding cover 70 made of a metal material through the conductive connecting ribs 33.

Figure 9:
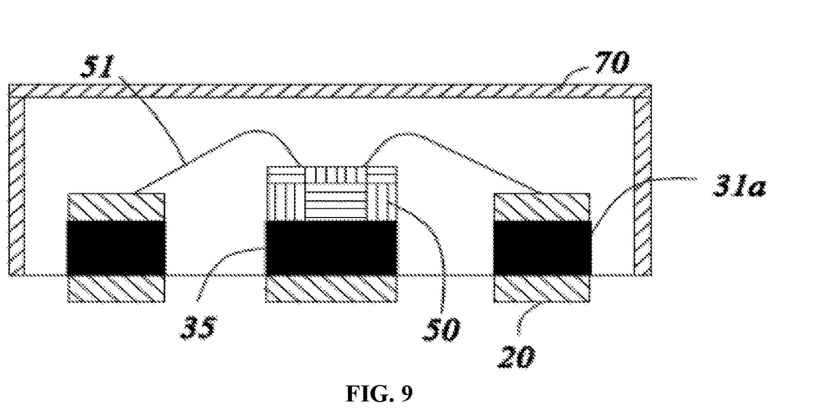
FIG. 9 is a schematic structural diagram of an electromagnetic shielding package structure packaged by the package method described in FIG. 8.

In combination with FIG. 9 and referring to related illustrations of the above method, an embodiment of the present invention provides an electromagnetic shielding package structure manufactured by the method described above. The electromagnetic shielding package structure includes: a circuit layer 30 made of a copper material, wherein the circuit layer includes functional pins 31a, grounding pins 31b, and conductive connecting ribs 33 connected to all the grounding pins 31b respectively and extending toward the side surface of the electromagnetic shielding package structure; a shielding cover 70 disposed on the front surface of the circuit layer 30 and forming a cavity with the circuit layer 30, wherein the side wall of the shielding cover 70 extends to the side surface of the circuit layer 30 and is connected to each of the conductive connecting ribs 33; an electroplating layer 20 disposed on the front surface and the back surface of the circuit layer 30; a chip 50 disposed in the cavity and electrically connected to the functional pins 31b; and a plastic package material 60 filling a gap between the cavity and the circuit layer 30, wherein the plastic package material 60 isolates the shielding cover 70 from contacting the functional pins 31a.

Figure 10:
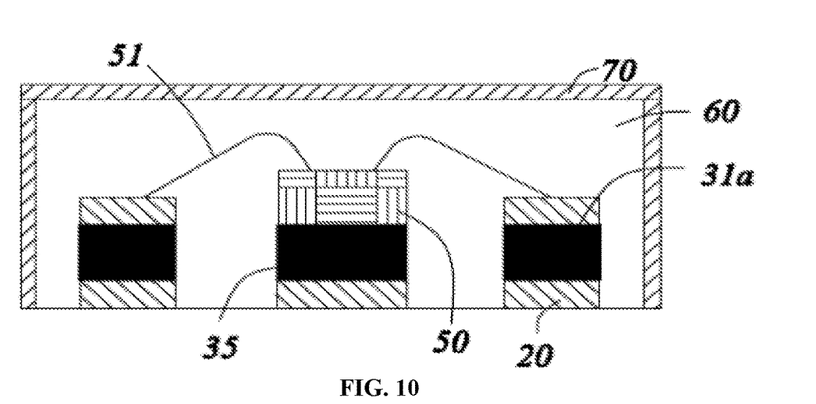
FIG. 10 is a schematic structural diagram of an electromagnetic shielding package structure packaged by the package method described in FIG. 2.

In combination with FIG. 10, in another embodiment of the present invention, the side wall of the shielding cover 70 extends to the electroplating layer 20; and the plastic package material 60 is also configured to fill a gap between the electroplating layers 20.

Those skilled in the art can clearly understand that, for the convenience and conciseness of description, the specific structure of the electromagnetic shielding package structure described above and the replacement manners of respective components may refer to the corresponding description in the foregoing method embodiments, which will not repeated herein.

In summary, in the electromagnetic shielding package structure and the package method thereof according to the present invention, the transition layer is directly formed on the base plate made of the copper raw material, the first encapsulating is performed on the transition layer, the conductive connecting ribs connected to the functional pins are removed by the etching process, and the secondary encapsulating is performed to fill the grooves of the conductive connecting ribs, so that the functional pins are wrapped in the plastic package material, the grounding pins are electrically connected to the shielding cover on the outer wall surface of the plastic package body through the conductive connecting ribs, and further the grounding pins inside the plastic package body are connected to a shielding metal to realize shielding, thereby improving the performance of the package, and saving the manufacturing cost and use cost.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustration listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A package method for an electromagnetic shielding package structure, wherein the package method comprises:
    a step S1, providing a base plate made of a copper raw material;
    a step S2, performing electroplating in an electroplating area of the base plate to form an electroplating layer on the base plate;
    a step S3, performing etching on the base plate on which the electroplating layer is formed to wholly form a transition layer, wherein the transition layer comprises: pins, conductive connecting ribs of each of which one end is connected to the pins and the other end extends to a singulated cutting line and the etched electroplating layer, and the pins comprise functional pins and grounding pins;
    a step S4, bonding a high temperature-resistant protective film on a back surface of the transition layer;
    a step S5, mounting a chip on a front surface of the transition layer, and electrically connecting the chip to the functional pins;
    a step S6, performing first encapsulating on the front surface of the transition layer;
    a step S7, peeling off the high temperature-resistant protective film covering the back surface of the transition layer;
    a step S8, etching off the conductive connecting ribs connected to the functional pins from the back surface of the transition layer to form grooves at positions of the functional pins corresponding to the etched conductive connecting ribs, so that the transition layer excluding the electroplating layer forms a circuit layer, wherein the circuit layer comprises the functional pins, the grounding pins, and the conductive connecting ribs connected to the grounding pins respectively;
    a step S9, performing secondary encapsulating from a back surface of the circuit layer, wherein an encapsulation area at least comprises the grooves formed in the step S8;
    a step S10, cutting a half-formed package formed in the step S9 from the singulated cutting line to form a plurality of singulated packages; and
    a step S11, sputtering a metal protective layer uniformly on a plastic package cover of each of the plurality of singulated packages to form a shielding cover, and enabling the conductive connecting ribs and the shielding cover to be conducted to form the electromagnetic shielding package structure.

2. The package method for the electromagnetic shielding package structure according to claim 1, wherein the step S1 specifically comprises:
    a step S1-1, providing the copper raw material; and
    a step S1-2, performing acid washing or alkali washing pretreatment on a copper surface of the copper raw material to clean the copper surface to acquire the base plate.

3. The package method for the electromagnetic shielding package structure according to claim 1, wherein the step S2 specifically comprises:
    a step S21, bonding a photoresist film on the base plate;
    a step S22, removing a part of the photoresist film through an exposure machine and a development machine to expose the electroplating area on the base plate;
    a step S23, electroplating nickel, palladium, gold or silver in the electroplating area of the base plate; and
    a step S24, peeling off remaining of the photoresist film on the base plate.

4. The package method for the electromagnetic shielding package structure according to claim 1, wherein the step S3 specifically comprises:
    a step S31, bonding another photoresist film on the base plate on which the electroplating layer is formed;
    a step S32, removing a part of the another photoresist film through the exposure machine and the development machine to expose an etching area;
    a step S33, etching off the base plate in the etching area to reserve the transition layer bonded to the another photoresist film; and
    a step S34, peeling off remaining of the another photoresist film to form the transition layer.

5. The package method for the electromagnetic shielding package structure according to claim 1, wherein between the step S3 and the step S4, the package method further comprises: dividing the transition layer formed in the step S3 into strips with a punch mold or router manner.

6. The package method for the electromagnetic shielding package structure according to claim 1, wherein the step S7 further comprises: removing a residual adhesive layer caused by removing the high temperature-resistant protective film on the back surface of the transition layer with a chemical agent.

7. The package method for the electromagnetic shielding package structure according to claim 1, wherein the encapsulation area of the secondary encapsulating further comprises: a non-plastic package area between portions of the electroplating layer on the back surface of the circuit layer.

8. The package method for the electromagnetic shielding package structure according to claim 1, wherein the metal protective layer sputtered on the plastic package cover of the each of the plurality of singulated packages sequentially comprises an inner stainless steel layer, a copper layer, and an outer stainless steel layer from inside to outside.

9. An electromagnetic shielding package structure, comprising:
    a circuit layer made of a copper material, wherein the circuit layer comprises functional pins, grounding pins, and conductive connecting ribs connected to the grounding pins respectively, and extending toward a side surface of the electromagnetic shielding package structure;
    a shielding cover disposed on a front surface of the circuit layer and forming a cavity with the circuit layer, wherein a side wall of the shielding cover extends to a side surface of the circuit layer and is connected to each of the conductive connecting ribs;

an electroplating layer disposed on the front surface and a back surface of the circuit layer;

a chip disposed in the cavity and electrically connected to the functional pins; and a plastic package material filling a gap between the cavity and the circuit layer, wherein the plastic package material isolates the shielding cover from contacting the functional pins.

10. The electromagnetic shielding package structure according to claim 9, wherein the side wall of the shielding cover extends to the electroplating layer; and the plastic package material is further configured to fill a gap between portions of the electroplating layer.

* * * * *